(12) United States Patent
Zhang et al.

(10) Patent No.: US 12,236,837 B2
(45) Date of Patent: Feb. 25, 2025

(54) POWER SUPPLY CIRCUIT, DRIVING METHOD THEREOF, PRINTED CIRCUIT BOARD, DISPLAY MODULE, AND DISPLAY APPARATUS

(71) Applicant: CHONGQING BOE OPTOELECTRONICS TECHNOLOGY CO., LTD., Chongqing (CN)

(72) Inventors: Ying Zhang, Beijing (CN); Jin Sha, Beijing (CN); Can Shen, Beijing (CN); Xiang Fang, Beijing (CN); Bo Ran, Beijing (CN); Chao Gao, Beijing (CN); Yao Chen, Beijing (CN); Yiming Cheng, Beijing (CN); Jinxiang Li, Beijing (CN); Shifei Huang, Beijing (CN); Shengjie Yin, Beijing (CN); Pan Chen, Beijing (CN); Jun Tao, Beijing (CN); Wendi Zhang, Beijing (CN); Zhou Zhang, Beijing (CN); Qiuju Xie, Beijing (CN); Jun Wei, Beijing (CN); Hongchao Su, Beijing (CN)

(73) Assignees: CHONGQING BOE OPTOELECTRONICS TECHNOLOGY CO., LTD., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/014,440

(22) PCT Filed: May 20, 2022

(86) PCT No.: PCT/CN2022/094148
§ 371 (c)(1),
(2) Date: Jan. 4, 2023

(87) PCT Pub. No.: WO2023/221101
PCT Pub. Date: Nov. 23, 2023

(65) Prior Publication Data
US 2024/0242656 A1    Jul. 18, 2024

(51) Int. Cl.
*G09G 3/20* (2006.01)
*H05K 1/02* (2006.01)

(52) U.S. Cl.
CPC ......... *G09G 3/2092* (2013.01); *H05K 1/0277* (2013.01); *G09G 2330/028* (2013.01)

(58) Field of Classification Search
CPC ...... G09G 3/20; G09G 3/2092; G09G 3/2096; G09G 5/003–006; G09G 2300/02;
(Continued)

(56) References Cited

U.S. PATENT DOCUMENTS

2016/0275848 A1*  9/2016  Zhang .................... G09G 3/20
2018/0158397 A1   6/2018  Nam et al.
(Continued)

FOREIGN PATENT DOCUMENTS

| CN | 102118516 A | 7/2011 |
| CN | 103019127 A | 4/2013 |

(Continued)

OTHER PUBLICATIONS

English translation of CN-114495821-A (Year: 2022).*

*Primary Examiner* — Nathan Danielsen
(74) *Attorney, Agent, or Firm* — WHDA, LLP

(57) ABSTRACT

A power supply circuit, a driving method thereof, a printed circuit board, a display module and a display apparatus are disclosed, which relates to a technical field of displaying. The power supply circuit includes a first power management chip and a second power management chip configured to be respectively connected with a display panel and provide
(Continued)

different driving signals to the display panel, and the driving signals are configured for driving the display panel to display.

19 Claims, 4 Drawing Sheets

(58) Field of Classification Search
CPC .......... G09G 2300/04; G09G 2300/0421–043; G09G 2300/088; G09G 2310/0243; G09G 2310/06; G09G 2310/08; G09G 2320/0204; G09G 2320/0223–0233; G09G 2320/0242; G09G 2320/0252; G09G 2320/04; G09G 2320/041; G09G 2320/0693; G09G 2330/02; G09G 2330/021; G09G 2330/025; G09G 2330/028–045
See application file for complete search history.

(56) References Cited

U.S. PATENT DOCUMENTS

| | | | |
|---|---|---|---|
| 2019/0312090 A1* | 10/2019 | Park | G06F 3/0412 |
| 2021/0020092 A1 | 1/2021 | Huang | |
| 2022/0310002 A1 | 9/2022 | Yu et al. | |
| 2024/0013691 A1* | 1/2024 | Zhao | G09G 3/20 |

FOREIGN PATENT DOCUMENTS

| | | | |
|---|---|---|---|
| CN | 206421807 U | | 8/2017 |
| CN | 107705769 A | | 2/2018 |
| CN | 108550350 A | | 9/2018 |
| CN | 109509422 A | | 3/2019 |
| CN | 208986673 U | | 6/2019 |
| CN | 211374961 U | | 8/2020 |
| CN | 213024368 U | | 4/2021 |
| CN | 113066433 A | | 7/2021 |
| CN | 113707094 A | | 11/2021 |
| CN | 114495821 A | * | 5/2022 |

* cited by examiner

POWER SUPPLY CIRCUIT, DRIVING METHOD THEREOF, PRINTED CIRCUIT BOARD, DISPLAY MODULE, AND DISPLAY APPARATUS

TECHNICAL FIELD

The disclosure relates to the technical field of displaying, and more particularly, to a power supply circuit, a driving method thereof, a printed circuit board, a display module, and a display apparatus.

BACKGROUND

With the increase in refresh rate, resolution, and display screen size, the power consumption required for normal displaying of the display screen is also increasing. The power consumption required by the display screen for displaying is provided by a power management chip.

SUMMARY

A power supply circuit is provided in this disclosure, which includes a first power management chip and a second power management chip.

The first power management chip and the second power management chip are configured to be respectively connected with a display panel and provide different driving signals to the display panel. The driving signals are configured for driving the display panel to display.

In an alternative implementation, the power supply circuit further includes a timing controller.

The timing controller is connected with at least one of the first power management chip and the second power management chip, and is configured to provide a clock signal to at least one of the first power management chip and the second power management chip.

In an alternative implementation, the power supply circuit further includes a control circuit.

The control circuit is connected with a control signal input terminal, a programming signal input terminal, the first power management chip and the second power management chip. The control signal input terminal is configured for providing a target control signal, and the programming signal input terminal is configured for providing a target programming signal. The control circuit is configured to perform following operations.

The programming signal input terminal is caused to be connected with a target power management chip and not to be connected with a non-target power management chip according to the target control signal to write the target programming signal into the target power management chip. The target power management chip is any one of the first power management chip and the second power management chip, and the non-target power management chip is a power management chip, different from the target power management chip, among the first power management chip and the second power management chip.

In an alternative implementation, the control circuit includes a generating module, a first gating branch, and a second gating branch.

The generating module is connected with the control signal input terminal, a first supply voltage input terminal and a ground potential input terminal, and is configured to generate a first sub-control signal and a second sub-control signal according to the target control signal, a first supply voltage signal input by the first supply voltage input terminal and a ground potential signal input by the ground potential input terminal.

The first gating branch is connected with the generating module, the programming signal input terminal and the first power management chip, and is configured to control connection between the programming signal input terminal and the first power management chip according to the first sub-control signal.

The second gating branch is connected with the generating module, the programming signal input terminal and the second power management chip, and is configured to control connection between the programming signal input terminal and the second power management chip according to the second sub-control signal.

In an optional implementation, the first gating branch includes a first transistor, a control electrode of which is connected with the generating module, a first electrode of which is connected with the programming signal input terminal, and a second electrode of which is connected with the first power management chip.

The second gating branch includes a second transistor, a control electrode of which is connected with the generating module, a first electrode of which is connected with the programming signal input terminal, and a second electrode of which is connected with the second power management chip.

In an alternative implementation, the first transistor and the second transistor are of a same type, which may be N-type transistors or P-type transistors.

In an alternative implementation, the first sub-control signal is configured to be input to the control electrode of the first transistor, and the second sub-control signal is configured to be input to the control electrode of the second transistor, and a phase of the first sub-control signal is opposite to that of the second sub-control signal.

In an alternative implementation, the first transistor and the second transistor are both N-type transistors, and turn-on voltages of the first transistor and the second transistor are both greater than or equal to 0.5 V.

In an alternative implementation, the first gating branch further includes a first resistor connected between a second supply voltage input and the second electrode of the first transistor.

The second gating branch further includes a second resistor connected between the second supply voltage input and the second electrode of the second transistor.

In an alternative implementation, the generating module includes a first sub-module and a second sub-module.

The first sub-module is connected with the control signal input terminal, the first supply voltage input terminal and the first gating branch, and is configured to generate a first sub-control signal according to the target control signal and the first supply voltage signal. The first sub-control signal is configured to be input to the first gating branch.

The second sub-module is connected with the first sub-module, the first supply voltage input terminal, the ground potential input terminal and the second gating branch, and is configured to generate a second sub-control signal according to the first sub-control signal, the first supply voltage signal and the ground potential signal. The second sub-control signal is configured to be input to the second gating branch.

In an alternative implementation, the first sub-module includes a third resistor connected between the control signal input terminal and the first supply voltage input terminal.

In an alternative implementation, the second sub-module includes a third transistor and a fourth resistor.

A control electrode of the third transistor is connected with the first sub-module, a first electrode of the third transistor is connected with the ground potential input terminal, and a second electrode of the third transistor is connected with the second gating branch.

The fourth resistor is connected between the second electrode of the third transistor and the first supply voltage input terminal.

In an optional implementation, any one of the first power management chip and the second power management chip is a default power management chip, and the target programming signal includes a common voltage. The common voltage is configured to be written into the default power management chip.

The control circuit is further configured to keep the programming signal input terminal being connected with the default power management chip when the target control signal input terminal is not detected at the control signal input terminal.

In an optional implementation, when the power supply circuit further includes the timing controller, the control signal input terminal is also connected with a first output of the timing controller, and the first output is also connected with an upper computer, and the first output is configured for receiving a control instruction sent by the upper computer, generating a target control signal corresponding to the control instruction, and outputting the target control signal to the control signal input terminal.

In an alternative implementation, the first output is configured as an open-drain output.

In an optional implementation, when the power supply circuit further includes the timing controller, the programming signal input terminal is also connected with a second output of the timing controller, and the second output is configured for outputting the target programming signal to the programming signal input terminal.

A printed circuit board is provided in this disclosure, which includes any one of the power supply circuits described above.

A display module is provided in this disclosure, which includes a display panel and any one of the power supply circuits described above. The first power management chip and the second power management chip are respectively connected with the display panel.

In an alternative implementation, the power supply circuit is located in a printed circuit board, and the display module further includes a flexible circuit board and a shielding tape.

The flexible circuit board is connected the printed circuit board and the display panel.

The shielding tape is configured for fixing the printed circuit board and the display panel. The printed circuit board is located at a backlight side of the display panel.

A display apparatus is provided in this disclosure, which comprises any one of the display modules described above.

A driving method of a power supply circuit is provided in this disclosure. The power supply circuit includes a first power management chip, a second power management chip and a control circuit. The first power management chip and the second power management chip are configured to be respectively connected with a display panel and provide different driving signals to the display panel. The driving signals are configured for driving the display panel to display. The control circuit is connected with a control signal input terminal, a programming signal input terminal, the first power management chip and the second power management chip. The driving method includes following contents.

A target control signal is provided to the control signal input terminal and a target programming signal is provided to the programming signal input terminal, so that the control circuit causes the programming signal input terminal to be connected with a target power management chip and not to be connected with a non-target power management chip according to the target control signal to write the target programming signal into the target power management chip. The target power management chip is any one of the first power management chip and the second power management chip, and the non-target power management chip is a power management chip, different from the target power management chip, among the first power management chip and the second power management chip.

In an alternative implementation, the target control signal includes a first control signal or a second control signal, and the target programming signal includes a first programming signal or a second programming signal. A step in which the target control signal is provided to the control signal input terminal and the target programming signal is provided to the programming signal input terminal includes the following contents.

The first control signal is provided to the control signal input terminal and the first programming signal is provided to the programming signal input terminal, so that the control circuit causes the programming signal input terminal to be connected with the first power management chip, and not to be connected with the second power management chip according to the first control signal to write the first programming signal into the first power management chip; or The second control signal is provided to the control signal input terminal and the second programming signal is provided to the programming signal input terminal, so that the control circuit causes the programming signal input terminal to be connected with the second power management chip, and not to be connected with the first power management chip according to the second control signal to write the second programming signal into the second power management chip.

The above description is only a summary of technical schemes of the present disclosure, which may be implemented according to contents of the specification in order to better understand technical means of the present disclosure; and in order to make above and other objects, features and advantages of the present disclosure more obvious and understandable, detailed description of the present disclosure is particularly provided in the following.

BRIEF DESCRIPTION OF THE DRAWINGS

In order to explain technical schemes in embodiments of this disclosure or related art more clearly, drawings required in the description of the embodiments or the related art will be briefly introduced below; obviously, the drawings in the following description are some of the embodiments of the present disclosure, and other drawings may be obtained according to these drawings by the ordinary skilled in the art without paying creative effort. It should be noted that a scale in the drawings is only schematic and does not indicate an actual one.

DETAILED DESCRIPTION OF THE EMBODIMENTS

In order to make purposes, technical schemes and advantages of embodiments of this disclosure more clear, the technical schemes in the embodiments of this disclosure will be described clearly and completely with reference to the drawings in the embodiments of this disclosure; and it is obvious that the described embodiments are part of the embodiments of this disclosure, but not all of them. On a basis of the embodiments in this disclosure, all other embodiments obtained by the ordinary skilled in the art without paying creative effort are within a protection scope of this disclosure.

With the increase of refresh rate, resolution, and display screen size, power consumption requirements for a display panel may not be satisfied by only providing one power management chip in a display module.

Figure 1:
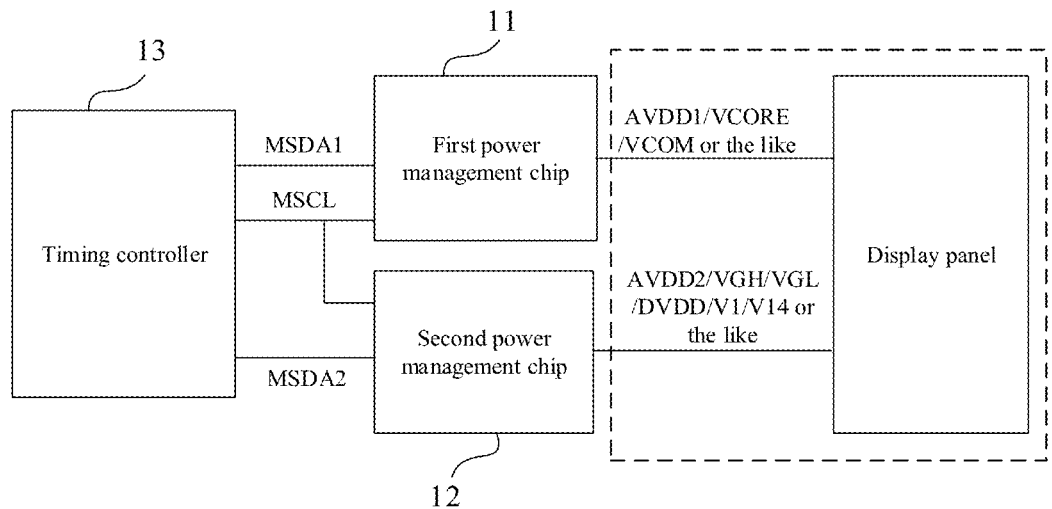
FIG. 1 schematically shows a connection structure diagram of a power supply circuit according to the present disclosure.
Figure 2:
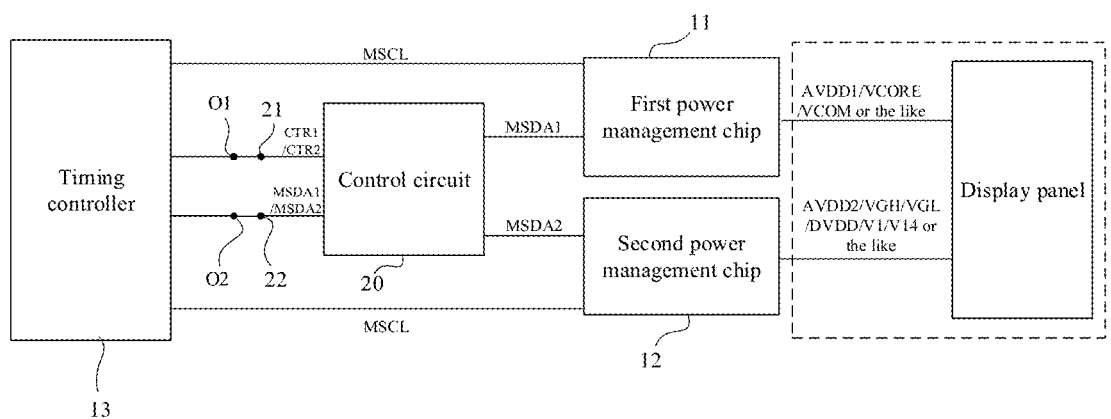
FIG. 2 schematically shows a connection structure diagram of another power supply circuit according to the present disclosure.

A power supply circuit is provided in the present disclosure. As shown in FIG. 1 and FIG. 2, the power supply circuit may include a first power management chip 11 and a second power management chip 12.

The first power management chip 11 and the second power management chip 12 are configured to be connected with a display panel, respectively, and provide different driving signals to the display panel. The driving signals are configured for driving the display panel to display.

For example, as shown in FIG. 1 and FIG. 2, the first power management chip 11 is connected with the display panel and provides a first driving signal to the display panel. The first driving signal may include voltage signals such as AVDD1, AVEE1, VCORE and VCOM.

The second power management chip 12 is connected with the display panel and provides a second driving signal to the display panel, and the first driving signal is different from the second driving signal. For example, the second driving signal may include voltage signals such as AVDD2, AVEE2, VGH, VGL, DVDD, V1 and V14.

When the refresh rate is high, a load on the display panel is large, and currents corresponding to signals such as AVDD and AVEE may reach 200 mA under a reload image. When a display signal is provided by multiple source driver chips to a data line for the display panel, each of the source driver chips needs high-current signals such as AVDD and AVEE.

For example, when the display signal is provided by four source driver chips to the data line for the display panel, a first power management chip 11 may be arranged to provide the high-current signals such as AVDD1 and AVEE1 to two of the source driver chips, and the second power management chip 12 may be arranged to provide high-current signals such as AVDD2 and AVEE2 to the other two of the source driver chips.

In addition, each of the source driver chip also needs a gamma signal and other signals such as VGH, VGL and VCOM. In order to ensure display uniformity of the display panel, each of these signals may be provided by a same power management chip, so that consistency of the signals may be ensured and the display uniformity may be improved.

For example, when the display signal is provided by four source driver chips to the data line for the display panel, the first power management chip 11 may be arranged to provide gamma signals and VCOM signals to the four source driver chips, and the second power management chip 12 may be arranged to provide VGH signals and VGL signals to the four source driver chips.

By providing two or more power management chips in the power supply circuit according to this disclosure, on the one hand, a display panel with a high refresh rate, a high resolution, or a large size may operate normally, and on the other hand, the temperature of a circuit board where the power management chips are located may be effectively reduced.

Optionally, as shown in FIG. 1 and FIG. 2, the power supply circuit further includes a timing controller 13. The timing controller 13 is connected with at least one of the first power management chip 11 and the second power management chip 12, and is configured to provide a clock signal MSCL to at least one of the first power management chip 11 and the second power management chip 12.

In a specific implementation, the timing controller 13 may be connected with the first power management chip 11 and provide the clock signal MSCL to the first power management chip 11. The timing controller 13 may also be connected with the second power management chip 12 and provide the clock signal MSCL to the second power management chip 12. The timing controller 13 may also be connected with the first power management chip 11 and the second power management chip 12, and provide the clock signal MSCL to the first power management chip 11 and the second power management chip 12, as shown in FIG. 1 and FIG. 2.

Programming addresses of the first power management chip 11 and the second power management chip 12 may be the same or different, which is not limited in this disclosure.

With the programming addresses of the first power management chip 11 and the second power management chip 12 being different, different voltage signals may be programmed into the first power management chip 11 and the second power management chip 12 according to the programming addresses.

Optionally, as shown in FIG. 1, the timing controller 13 is connected with the first power management chip 11 and the second power management chip 12, and different voltage signals may be programmed into the first power management chip 11 and the second power management chip 12 by the timing controller 13. For example, the timing controller 13 is controlled to program the first programming signal MSDA1 into the first power management chip 11 and the timing controller 13 is controlled to program the second programming signal MSDA2 into the second power management chip 12.

With programming addresses of the first power management chip 11 and the second power management chip 12 being the same, only the same voltage signal may be programmed into the first power management chip 11 and the second power management chip 12 if a structure shown in FIG. 1 is adopted for programming.

If it is necessary to program different voltage signals to the first power management chip 11 and the second power management chip 12 with a same programming address, respectively, they may only be connected and programmed by adding chip test points. In addition, if the first power management chip 11 and the second power management chip 12 are assembled in the display module, it is required to tear off a shielding tape around the display module and disassemble the display module, which greatly increases workloads.

To solve the above problems, a power supply circuit is provided in this disclosure. As shown in FIG. 2, the power supply circuit further includes a control circuit 20, which is connected with a control signal input terminal 21, a programming signal input terminal 22, a first power management chip 11 and a second power management chip 12, respectively.

The control signal input terminal 21 is configured to provide a target control signal, and the programming signal input terminal 22 is configured to provide a target programming signal.

The control circuit 20 is configured to cause the programming signal input terminal 22 to be connected with a target power management chip and not to be connected with a non-target power management chip according to the target control signal to write the target programming signal into the target power management chip.

The target power management chip is any one of the first power management chip 11 and the second power management chip 12, and the non-target power management chip is a power management chip, different from the target power management chip, among the first power management chip 11 and the second power management chip 12.

When the target power management chip is the first power management chip 11, the second power management chip 12 is the non-target power management chip; and when the target power management chip is the second power management chip 12, the first power management chip 11 is the non-target power management chip.

By providing the control circuit 20 connected with the first power management chip 11 and the second power management chip 12 in the power supply circuit, the control circuit 20 may cause the programming signal input terminal 22 to be connected with one power management chip (i.e. the target power management chip) and not to be connected with the programming signal input terminal 22 from another power management chip (i.e. the non-target power management chip) according to an input target control signal. That is, the programming signal input terminal 22 is in a conducting state with only one target power management chip at a same time point, so that a target programming signal input terminal by the programming signal 20) input terminal 22 may be written into the target power management chip, thus avoiding writing same voltage data to the first power management chip 11 and the second power management chip 12 at the same time.

With the power supply circuit provided in the present disclosure, different target programming signals may be written into the first power management chip 11 and the second power management chip 12, and even if the programming addresses of the first power management chip 11 and the second power management chip 12 are the same, different voltage data may be programmed into the first power management chip 11 and the second power management chip 12.

In a specific implementation, by inputting different target control signals at the control signal input terminal 21, the target power management chip may be switched between the first power management chip 11 and the second power management chip 12.

For example, a target control signal input by the control signal input terminal 21 may be a first control signal CTR1 or a second control signal CTR2, and a target programming signal input terminal by the programming signal input terminal 22 may be a first programming signal MSDA1 or a second programming signal MSDA2.

For example, the control circuit 20 may be specifically configured to:

cause the programming signal input terminal 22 to be connected with the first power management chip 11 and not to be connected with the second power management chip 12 according to the first control signal CTR1 input by the control signal input terminal 21 to write the first programming signal MSDA1 into the first power management chip 11; or, cause the programming signal input terminal 22 to be connected with the second power management chip 12 and not to be connected with the first power management chip 11 according to the second control signal CTR2 input by the control signal input terminal 21 to write the second programming signal MSDA2 into the second power management chip 12.

The first programming signal MSDA1 and the second programming signal MSDA2 may be different, so that different voltage data may be programmed into the first power management chip 11 and the second power management chip 12, respectively. Certainly, the first programming signal MSDA1 and the second programming signal MSDA2 may also be the same, which is not limited in this disclosure.

Figure 3:
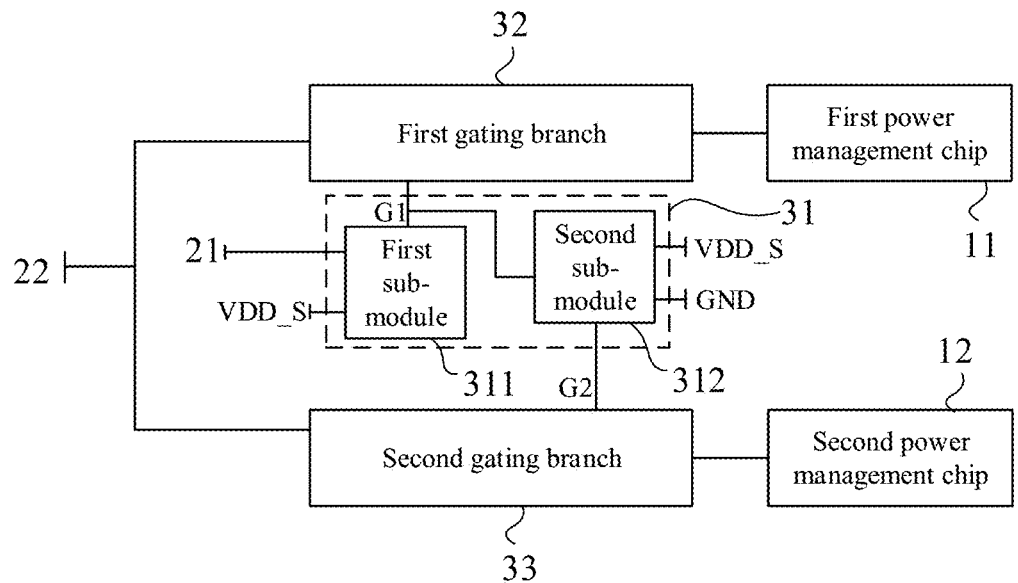
FIG. 3 schematically shows a frame structure diagram of a control circuit according to the present disclosure.

Optionally, referring to FIG. 3, the power supply circuit includes a generating module 31 connected with the control signal input terminal 21, a first supply voltage input terminal VDD_S and a ground potential input terminal GND, and is configured to generate a first sub-control signal G1 and a second sub-control signal G2 according to the target control signal, a first supply voltage signal input by the first supply voltage input terminal VDD_S and a ground potential signal input by the ground potential input terminal GND.

Referring to FIG. 3, the power supply circuit may further include a first gating branch 32, which is connected with the generating module 31, the programming signal input terminal 22 and the first power management chip 11, and is configured to control the connection between the programming signal input terminal 22 and the first power management chip 11 according to the first sub-control signal G1.

Referring to FIG. 3, the power supply circuit may further include a second gating branch 33, which is connected with the generating module 31, the programming signal input terminal 22, and the second power management chip 12, and is configured to control the connection between the programming signal input terminal 22 and the second power management chip 12 according to the second sub-control signal G2.

The first sub-control signal G1 is configured to be input to the first gating branch 32, and the second sub-control signal G2 is configured to be input to the second gating branch 33.

Figure 4:
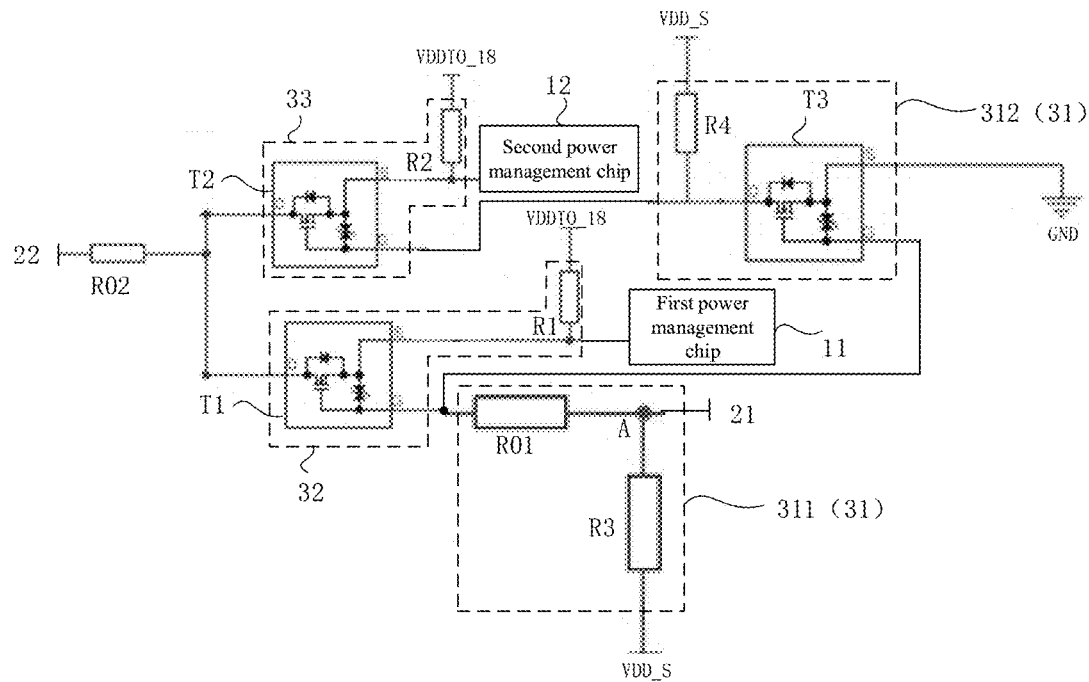
FIG. 4 schematically shows an exemplary structural diagram of a control circuit according to the present disclosure.

Referring to FIG. 4, the first gating branch 32 may include a first transistor T1. A control electrode G of the first transistor T1 is connected with the generation module 31, a first electrode D of the first transistor T1 is connected with the programming signal input terminal 22, and a second electrode S of the first transistor T1 is connected with the first power management chip 11.

Referring to FIG. 4, the second gating branch 33 may include a second transistor T2. A control electrode G of the second transistor T2 is connected with the generation module 31, a first electrode D of the second transistor T2 is connected with the programming signal input terminal 22, and a second electrode S of the second transistor T2 is connected with the second power management chip 12.

Optionally, the first transistor T1 is of a same type as the second transistor T2.

The transistors may be a N-type transistor or a P-type transistor.

For example, the first transistor T1 and the second transistor T2 may both be N-type transistors (as shown in FIG. 4), or the first transistor T1 and the second transistor T2 may both be P-type transistors.

The first sub-control signal G1 is configured to be input to the control electrode G of the first transistor, and the second sub-control signal G2 is configured to be input to the control electrode G of the second transistor.

Optionally, when the first transistor T1 and the second transistor T2 are of the same type, a phase of the first sub-control signal G1 is opposite to that of the second sub-control signal G2. In this way, it may be realized that when the first transistor T1 is on, the second transistor T2 is off, and when the second transistor T2 is on, the first transistor T1 is off, thus ensuring that the programming signal input terminal 22 is only connected with one power management chip at the same time point, and avoiding writing the same programming data to two or more power management chips at the same time.

Figure 5:
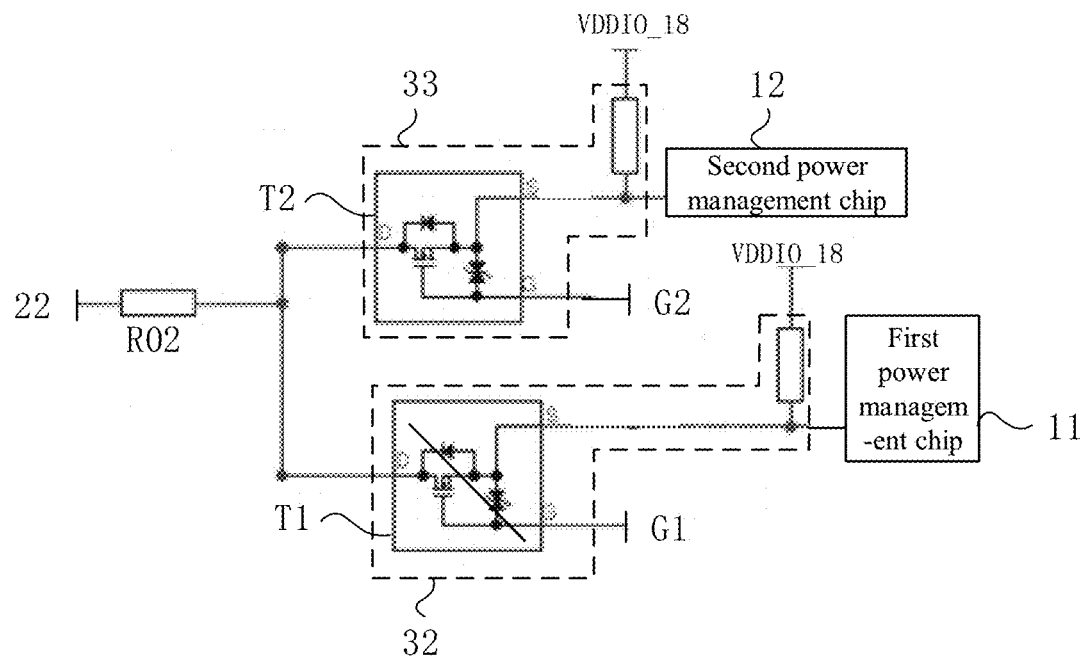
FIG. 5 schematically shows an equivalent structural diagram of the first gating branch and the second gating branch in a first operating state.
Figure 6:
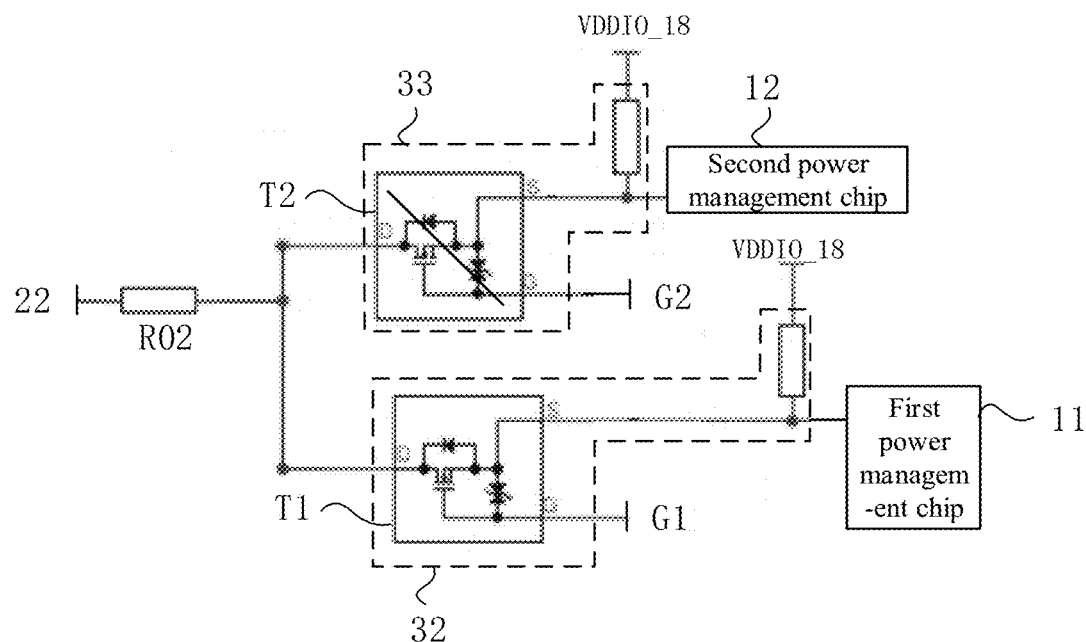
FIG. 6 schematically shows an equivalent structural diagram of the first gating branch and the second gating branch in a second operating state.

If both the first transistor T1 and the second transistor T2 are N-type transistors, when the first sub-control signal G1 is at a low level and the second sub-control signal G2 is at a high level, the first transistor T1 is off and the second transistor T2 is on, the programming signal input terminal 22 is disconnected from the first power management chip 11 and the programming signal input terminal 22 is connected with the second power management chip 12, and an equivalent structural diagram of the gating module in this operating state is shown referring to FIG. 5. When the first sub-control signal G1 is at a high level and the second sub-control signal G2 is at a low level, the first transistor T1 is on and the second transistor T2 is off, the programming signal input terminal 22 is connected with the first power management chip 11, and the programming signal input terminal 22 is disconnected from the second power management chip 12, and an equivalent structural diagram of the gating module in this operating state is shown referring to FIG. 6.

Figure 7:
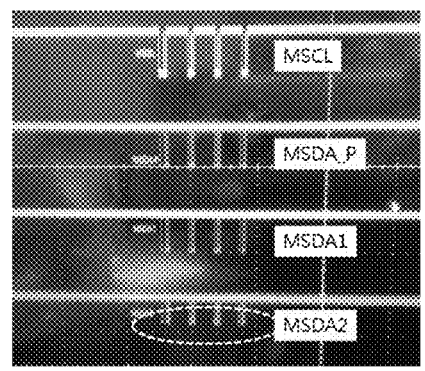
FIG. 7 schematically shows a timing signal detection result of the control circuit according to the present disclosure in a first operating state.

Referring to FIG. 7, a timing signal detection result of the power supply circuit according to the present disclosure is shown when the programming signal input terminal 22 is connected with the first power management chip 11. As shown in FIG. 7, when the programming signal input terminal 22 is connected with the first power management chip 11, there may be a weak voltage signal between the programming signal input terminal 22 and the second power management chip 12; and in order to ensure that the programming signal input terminal 22 remain disconnected from the second power management chip 12 when the programming signal input terminal 22 is connected with the first power management chip 11, optionally, the first transistor T1 and the second transistor T2 are both N-type transistors and turn-on voltages of the first transistor T1 and the second transistor T2 are both greater than or equal to 0.5 V.

By setting voltage drops of body diodes of the first transistor T1 and the second transistor T2 to be greater than or equal to 0.5 V, the first transistor T1 and the second transistor T2 may be prevented from being turned on at the same time, and the same programming signal may be prevented from being written into the first power management chip 11 and the second power management chip 12 at the same time.

Optionally, referring to FIG. 4, the first gating branch 32 further includes a first resistor R1 connected between a second supply voltage input VDDIO_18 and the second electrode S of the first transistor T1.

The first resistor R1 is arranged between the second supply voltage input VDDIO_18 and the second electrode S of the first transistor T1 to function as a pull-up resistor, and resistance of the first resistor R1 may be greater than or equal to 1 kilohm and less than or equal to 10 kilohms. For example, the resistance of the first resistor R1 may be 5.1 kilohms.

Optionally, the second gating branch 33 further includes a second resistor R2 connected between the second supply voltage input VDDIO_18 and the second electrode S of the second transistor T2.

The second resistor R2 is arranged between the second supply voltage input VDDIO_18 and the second electrode S of the second transistor T2 to function as a pull-up resistor, and resistance of the second resistor R2 may be greater than or equal to 1 kilohm and less than or equal to 10 kilohms. For example, the resistance of the second resistor R2 may be 5.1 kilohms.

In an alternative implementation, referring to FIG. 3, the generating module 31 includes a first sub-module 311.

The first sub-module 311 is connected with the control signal input terminal 21, the first supply voltage input terminal VDD_S and the first gating branch 32, and is configured to generate a first sub-control signal G1 according to the target control signal and the first supply voltage signal. The first sub-control signal G1 is configured to be input to the first gating branch 32.

In this implementation, referring to FIG. 3, the generating module 31 may further include a second sub-module 312.

The second sub-module 312 is connected with the first sub-module 311, the first supply voltage input terminal VDD_S, the ground potential input terminal GND and the second gating branch 33, and is configured to generate a second sub-control signal G2 according to the first sub-control signal G1, the first supply voltage signal and the ground potential signal. The second sub-control signal G2 is configured to be input to the second gating branch 33.

When the first gating branch 32 includes the first transistor T1, the second gating branch 33 includes the second transistor T2, and the first transistor T1 and the second transistor T2 are of the same type, the second sub-module 312 may be specifically configured to generate the second sub-control signal G2 with an opposite phase to the first sub-control signal G1 according to the first sub-control signal G1, the first supply voltage signal and the ground potential signal.

Optionally, referring to FIG. 4, the first sub-module 311 includes a third resistor R3 connected between the control signal input terminal 21 and the first supply voltage input terminal VDD_S.

The third resistor R3 is arranged between the control signal input terminal 21 and the first supply voltage input terminal VDD_S to function as a pull-up resistor, and resistance of the third resistor R3 may be greater than or equal to 1 kilohm and less than or equal to 10 kilohms. For example, the resistance of the third resistor R3 may be 5.1 kilohms.

In FIG. 4, a first node A is connected with the control signal input terminal 21, and the third resistor R3 is arranged between the first node A and the first supply voltage input terminal VDD_S. Optionally, as shown in FIG. 4, a first divider resistor R01 may be further arranged between the first node A and the first gating branch 32. The first divider resistor R01 may be selectively set according to actual situation, which is not limited in this disclosure.

Optionally, referring to FIG. 4, the second sub-module 312 includes a third transistor T3, the control electrode G is connected with the first sub-module 311, the first electrode S is connected with the ground potential input terminal GND, and the second electrode D is connected with the second gating branch 33.

As shown in FIG. 4, the second sub-module 312 may further include a fourth resistor R4 connected between a second electrode D of the third transistor T3 and the first supply voltage input terminal VDD_S.

The fourth resistor R4 is arranged between the second electrode D of the third transistor T3 and the first supply voltage input terminal VDD_S to function as a pull-up resistor, and resistance of the fourth resistor R4 may be greater than or equal to 1 kilohm and less than or equal to 10 kilohms. For example, the resistance of the fourth resistor R4 may be 5.1 kilohms.

The third transistor T3 may be an N-type transistor, and accordingly, a turn-on voltage of the third transistor T3 is greater than or equal to 0.5 V.

In an alternative implementation, any one of the first power management chip 11 and the second power management chip 12 is the default power management chip, that is, either the first power management chip 11 or the second power management chip 12 may serve as the default power management chip. The target programming signal includes a common voltage VCOM, which is configured to be written into the default power management chip.

Accordingly, the control circuit 20 is further configured to keep the programming signal input terminal 22 being connected with the default power management chip when the target control signal input terminal 21 is not detected at the control signal input terminal. That is, by default, connection between the programming signal input terminal 22 and the default power management chip may be maintained, so that the common voltage in the default power management chip may be modified according to a flicker value of the display panel in a production process.

Referring to FIG. 2, when the power supply circuit further includes the timing controller 13, the control signal input terminal 21 is also connected with a first output terminal O1 of the timing controller 13. The first output terminal O1 is also connected with an upper computer (not shown), and the first output terminal O1 is configured for receiving a control instruction sent by the upper computer, generating a target control signal corresponding to the control instruction, and outputting the target control signal to the control signal input terminal 21.

Optionally, the first output terminal O1 is configured as an open-drain output.

Referring to FIG. 2, when the power supply circuit further includes the timing controller 13, the programming signal input terminal 22 is also connected with the second output terminal O2 of the timing controller 13, and the second output terminal O2 is configured to output the target programming signal to the programming signal input terminal 22.

Optionally, referring to FIG. 4, the control circuit 20 may further include a second divider resistor R02 arranged between the programming signal input terminal 22 and the first gating branch 32 and the second gating branch 33. The second divider resistor R02 may be selectively set according to actual situation, which is not limited in this disclosure.

For example, as shown in FIG. 4, the first transistor T1, the second transistor T2, and the third transistor T3 are all N-type transistors. The first transistor T1, the second transistor T2, and the third transistor T3 are turned on under a condition that Vgs (voltage difference between a gate G and a source S) is greater than 0.95 V, the first supply voltage input by the first supply voltage input terminal VDD_S is 3.3 V and the second power supply input by the second supply voltage input terminal VDDIO_18 is 1.8 V. The control signal input terminal 21 is connected with the first output terminal O1 of the timing controller 13, and the first output terminal O1 is an open-drain output.

Referring to FIG. 2 and FIG. 4, by default, the first output terminal O1 is in a floating state. Since the first output terminal O1 is connected with the first supply voltage input terminal VDD_S through the third resistor R3, the target control signal input terminal by the first output terminal O1 to the control signal input terminal 21 is a high-level signal. With the high-level target control signal, a high-level first sub-control signal G1 is output through the first sub-module 311, and with this high-level first sub-control signal G1, a low-level second sub-control signal G2 is output through the second sub-module 312. Because the high-level first sub-control signal G1 is input to the control electrode G of the first transistor T1, the first electrode D of the first transistor T1 is connected with the second electrode S of the first transistor T1, that is, the programming signal input terminal 22 is connected with the first power management chip 11. At this time, a voltage of the first power management chip 11 may be modified by the timing controller 13 to complete programming of the first power management chip 11. At the same time, since the low-level second sub-control signal G2 is input to the control electrode G of the second transistor T2, the first electrode D of the second transistor T2 is disconnected from the second electrode S of the second transistor T2, that is, the programming signal input terminal 22 is disconnected from the second power management chip 12.

In a default state, the programming signal input terminal 22 is connected with the first power management chip 11, so in this case, the first power management chip 11 may be set as the default power management chip, that is, the common voltage may be written into the first power management chip 11.

When the second power management chip 12 needs to be programmed, a corresponding control instruction may be sent from the upper computer to change the first output terminal O1 of the timing controller 13 to a grounded state, so that the target control signal input terminal from the first output terminal O1 to the control signal input terminal 21 is a low-level signal. With the low-level target control signal, a low-level first sub-control signal G1 is output through the first sub-module 311, and with this low-level first sub-control signal G1, a high-level second sub-control signal G2 is output through the second sub-module 312. Since the low-level first sub-control signal G1 is input to the control electrode G of the first transistor T1, the first electrode D is disconnected from the second electrode S of the first transistor T1. Meanwhile, because the high-level second sub-control signal G2 is input to the control electrode G of the second transistor T2, the first electrode D of the second transistor T2 is connected with the second electrode S of the second transistor T2, that is, the programming signal input terminal 22 is connected with the second power management chip 12. At this time, a voltage of the second power management chip 12 may be modified by the timing controller 13 to complete programming of the second power management chip 12.

Afterwards, when the first power management chip 11 needs to be programmed, a corresponding control instruction may be sent from the upper computer to change the first output terminal O1 of the timing controller 13 to the floating state, so that the target control signal input terminal from the first output terminal O1 to the control signal input terminal 21 is a high-level signal. With the high-level target control signal, a high-level first sub-control signal G1 is output through the first sub-module 311, and with this high-level first sub-control signal G1, a low-level second sub-control signal G2 is output through the second sub-module 312. Because the high-level first sub-control signal G1 is input to the control electrode G of the first transistor T1, the first electrode D of the first transistor T1 is connected with the second electrode S of the first transistor T1, that is, the programming signal input terminal 22 is connected with the first power management chip 11. At this time, a voltage of the first power management chip 11 may be modified by the timing controller 13 to complete programming of the first power management chip 11. At the same time, since the low-level second sub-control signal G2 is input to the control electrode G of the second transistor T2, the first electrode D of the second transistor T2 is disconnected from the second electrode S of the second transistor T2, that is, the programming signal input terminal 22 is disconnected from the second power management chip 12.

It should be noted that when the first transistor T1, the second transistor T2 and the third transistor T3 are all N-type transistors, the control electrode G of the first transistor T1 is a gate, a first electrode D of the first transistor T1 is a drain, and a second electrode S of the first transistor T1 is a source. The control electrode G of the second transistor T2 is a gate, the first electrode D of the second transistor T2 is a drain, and the second electrode S of the second transistor T2 is a source. The control electrode G of the third transistor T3 is a gate, the first electrode S of the third transistor T3 is a source and the second electrode D of the third transistor T3 is a drain.

A printed circuit board is provided in this disclosure, which includes any one of the power supply circuits described above.

As the printed circuit board includes the power supply circuit described above, it may be understood by those skilled in the art that the printed circuit board has advantages of the power supply circuit according to the present disclosure, which will not be repeatedly described here again.

Figure 8:
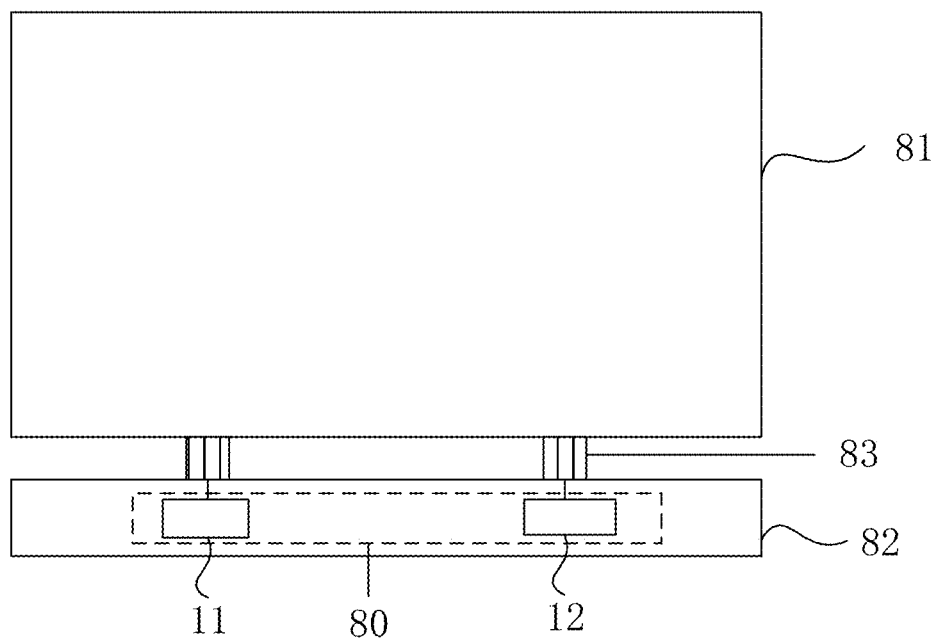
FIG. 8 schematically shows a structural diagram of a display module according to the present disclosure.

Referring to FIG. 8, a display module is provided in this disclosure, which includes a display panel 81 and any one of the power supply circuits 80 described above. The first power management chip 11 and the second power management chip 12 are connected with the display panel 81, respectively.

As the display module includes the power supply circuit 80 described above, it may be understood by those skilled in the art that the display module has advantages of the power supply circuit 80 according to the present disclosure, which will not be repeatedly described here again.

Optionally, the power supply circuit 80 is located in the printed circuit board 82. Accordingly, the display module may further include a flexible circuit board 83 connecting the printed circuit board 82 and the display panel 81; and a shielding tape (not shown) for fixing the printed circuit board 82 and the display panel 81, the printed circuit board 82 being located at a backlight side of the display panel 81.

In some embodiments, the shielding tape may be a black tape to prevent irradiation. The shielding tape has an insulator provided at a surface thereof. The shielding tape may contain copper foil or aluminum foil therein, which facilitates heat dissipation.

A display apparatus is provided in this disclosure, which comprises any one of the display modules described above.

Since the display apparatus includes the display module described above, it may be understood by those skilled in the art that the display apparatus has advantages of the display module according to the present disclosure, which will not be repeatedly described here again.

It should be noted that the display apparatus in this embodiment may be any product or component with 2D or 3D display function, such as an electronic paper, a mobile phone, a tablet computer, a television, a notebook computer, a digital photo frame, a virtual reality device, a augmented reality device, an under display camera device and a navigator.

A driving method of a power supply circuit is provided in this disclosure. Referring to FIG. 2, the power supply circuit includes a first power management chip 11, a second power management chip 12 and a control circuit 20. The first power management chip 11 and the second power management chip 12 are configured to be connected with a display panel, respectively and provide different driving signals to the display panel. The driving signals are configured for driving the display panel to display. The control circuit 20 is connected with a control signal input terminal 21, a programming signal input terminal 22, the first power management chip 11 and the second power management chip 12. The driving method includes:

A target control signal is provided to the control signal input terminal 21 and a target programming signal is provided to the programming signal input terminal 22, so that the control circuit 20 causes the programming signal input terminal 22 to be connected with a target power management chip and not to be connected with a non-target power management chip according to the target control signal to write the target programming signal into the target power management chip. The target power management chip is any one of the first power management chip 11 and the second power management chip 12, and the non-target power management chip is a power management chip, different from the target power management chip, among the first power management chip 11 and the second power management chip 12.

The driving method according to the present disclosure may be applied to any of the power supply circuits described above according to the FIG. 2 to FIG. 4.

Optionally, the target control signal includes a first control signal CTR1 or a second control signal CTR2, and the target programming signal includes a first programming signal MSDA1 or a second programming signal MSDA2. A step in which the target control signal is provided to the control signal input terminal 21 and the target programming signal is provided to the programming signal input terminal 22 includes:

The first control signal CTR1 is provided to the control signal input terminal 21 and the first programming signal MSDA1 is provided to the programming signal input terminal 22, so that the control circuit 20 causes the programming signal input terminal 22 to be connected with the first power management chip 11 and not to be connected with the second power management chip 12 according to the first control signal CTR1 to write the first programming signal MSDA1 into the first power management chip 11; or, the second control signal CTR2 is provided to the control signal input terminal 21 and the second programming signal MSDA2 is provided to the programming signal input terminal 22, so that the control circuit 20 causes the programming signal input terminal 22 to be connected with the second power management chip 12 and not to be connected with the first power management chip 11 according to the second control signal CTR2 input to write the second programming signal MSDA2 into the second power management chip 12.

All the embodiments in this specification are described in a progressive way, and each embodiment focuses on differences from other embodiments. The same and similar parts among the embodiments may be referred to each other.

Finally, it should be noted that in this document, relational terms such as "first" and "second" are only used to distinguish one entity or operation from another entity or operation, and do not necessarily require or imply any such actual relationship or sequence among these entities or operations. Moreover, terms "comprising". "including" or any other variation thereof are intended to encompass a non-exclusive inclusion, so that a process, method, article or device including a series of elements includes not only those elements, but also other elements not explicitly listed, or elements inherent to such a process, method, article or device. Without further restrictions, an element defined by the statement "includes a . . . " does not exclude presence of other identical elements in the process, method, article or apparatus including the element.

The power supply circuit, the driving method thereof, the printed circuit board, the display module and the display apparatus according to the disclosure are introduced in detail above. In this document, specific examples are used to explain principle and implementations of the disclosure. Explanations of the embodiments described above are only used to facilitate understanding of methods and core ideas of the disclosure. Meanwhile, changes may be made to the specific implementation and application scope by ordinary skilled in the art according to the ideas of this disclosure. To sum up, contents of this specification should not be construed as limitation to this disclosure.

Other embodiments of the present disclosure will readily occur to those skilled in the art with considering the specification and practicing the disclosure provided herein. This disclosure is intended to cover any variations, uses or adaptations of this disclosure, which follow general principles of this disclosure and include common knowledge or customary practice in the art not provided in this disclosure. The specification and embodiments are regarded to be exemplary only, and a true scope and spirit of the present disclosure are indicated by following claims.

It should be understood that the present disclosure is not limited to a precise structure described above and shown in the drawings, and various modifications and changes may be made without departing from its scope. The scope of this disclosure is limited only by appended claims.

Reference to "one embodiment". "an embodiment" or "one or more embodiments" herein means that a specific feature, structure or characteristic described in connection with embodiments is included in at least one embodiment of the present disclosure. In addition, it is noted that an example of a word "in one embodiment" here do not necessarily refer to a same embodiment.

In the specification provided here, numerous specific details are set forth. However, it may be understood that the embodiments of the present disclosure may be practiced without these specific details. In some instances, well-known methods, structures and techniques have not been shown in detail in order not to obscure understanding of this specification.

In the claims, any reference signs between parentheses shall not be construed as limitations on the claims. A word "comprising" does not exclude presence of elements or steps not listed in a claim. A word "a" or "an" preceding an element does not exclude presence of a plurality of such elements. The present disclosure may be realized by means of hardware including several different elements and by means of a suitably programmed computer. In a unit claim enumerating several device, several of these device may be embodied by a same item of hardware. Use of words "first", "second", "third", etc. does not indicate any order. These words may be interpreted as names.

Finally, it should be noted that the above embodiments are only intended to illustrate technical schemes of the present disclosure, but not to limit it. Although the present disclosure has been described in detail with reference to the foregoing embodiments, it should be understood by ordinary skilled in the art that modifications may be made to the technical schemes described in the foregoing embodiments, or equivalent substitutions may be made to some technical features thereof. These modifications or substitutions do not make essence of corresponding technical schemes depart from the spirit and scope of the technical schemes of the embodiments of this disclosure.

The invention claimed is:

1. A power supply circuit, comprising a first power management chip and a second power management chip configured to be connected with a display panel, respectively, and provide different driving signals to the display panel, the driving signals being configured for driving the display panel to display, the power supply circuit further comprising a control circuit connected with a control signal input terminal, a programming signal input terminal, the first power management chip and the second power management chip, the control signal input terminal being configured for providing a target control signal, the programming signal input terminal being configured for providing a target programming signal, the control circuit being configured for, according to the target control signal, causing the programming signal input terminal to be connected with a target power management chip and not to be connected with a non-target power management chip, to write the target programming signal into the target power management chip, the target power management chip being any one of the first power management chip and the second power management chip, and the non-target power management chip being a power management chip, different from the target power management chip, among the first power management chip and the second power management chip.

2. The power supply circuit according to claim 1, further comprising:

a timing controller connected with at least one of the first power management chip and the second power management chip and configured for providing a clock signal to at least one of the first power management chip and the second power management chip.

3. The power supply circuit according to claim 2, wherein when the power supply circuit further comprises the timing controller, the control signal input terminal is also connected with a first output of the timing controller, the first output being further connected with an upper computer, and the first output being configured for receiving a control instruction sent by the upper computer, generating a target control signal corresponding to the control instruction, and outputting the target control signal to the control signal input terminal.

4. The power supply circuit according to claim 2, wherein when the power supply circuit further comprises the timing controller, the programming signal input terminal is also connected with a second output of the timing controller, the second output being configured for outputting the target programming signal to the programming signal input terminal.

5. The power supply circuit according to claim 1, wherein the control circuit comprises:
a generating module being connected with the control signal input terminal, a first supply voltage input terminal and a ground potential input terminal, and configured for generating a first sub-control signal and a second sub-control signal according to the target control signal, a first supply voltage signal input by the first supply voltage input terminal and a ground potential signal input by the ground potential input terminal;
a first gating branch connected with the generating module, the programming signal input terminal and the first power management chip, and configured for controlling connection between the programming signal input terminal and the first power management chip according to the first sub-control signal; and
a second gating branch connected with the generating module, the programming signal input terminal and the second power management chip, and configured for controlling connection between the programming signal input terminal and the second power management chip according to the second sub-control signal.

6. The power supply circuit according to claim 5, wherein the first gating branch comprises a first transistor, a control electrode of which is connected with the generating module, a first electrode of which is connected with the programming signal input terminal, and a second electrode of which is connected with the first power management chip; and
the second gating branch comprises a second transistor, a control electrode of which is connected with the generating module, a first electrode of which is connected with the programming signal input terminal, and a second electrode of which is connected with the second power management chip.

7. The power supply circuit according to claim 6, wherein the first transistor and the second transistor are of a same type, which are N-type transistors or P-type transistors.

8. The power supply circuit according to claim 7, wherein the first sub-control signal is configured to be input to the control electrode of the first transistor, and the second sub-control signal is configured to be input to the control electrode of the second transistor, and a phase of the first sub-control signal is opposite to a phase of the second sub-control signal.

9. The power supply circuit according to claim 6, wherein the first transistor and the second transistor are both N-type transistors, and turn-on voltages of the first transistor and the second transistor are both greater than or equal to 0.5 V.

10. The power supply circuit according to claim 6, wherein the first gating branch further comprises a first resistor connected between a second supply voltage input and the second electrode of the first transistor; and
the second gating branch further comprises a second resistor connected between the second supply voltage input and the second electrode of the second transistor.

11. The power supply circuit according to claim 5, wherein the generating module comprises:
a first sub-module connected with the control signal input terminal, the first supply voltage input terminal and the first gating branch, and configured for generating a first sub-control signal according to the target control signal and the first supply voltage signal, the first sub-control signal being configured to be input to the first gating branch; and
a second sub-module connected with the first sub-module, the first supply voltage input terminal, the ground potential input terminal and the second gating branch, and configured for generating a second sub-control signal according to the first sub-control signal, the first supply voltage signal and the ground potential signal, the second sub-control signal being configured to be input to the second gating branch.

12. The power supply circuit according to claim 11, wherein the first sub-module comprises a third resistor connected between the control signal input terminal and the first supply voltage input terminal.

13. The power supply circuit according to claim 11, wherein the second sub-module comprises:
a control electrode of the third transistor connected with the first sub-module, a first electrode of the third transistor is connected with the ground potential input terminal, and a second electrode of the third transistor is connected with the second gating branch; and
a fourth resistor connected between the second electrode of the third transistor and the first supply voltage input terminal.

14. The power supply circuit according to claim 1, wherein any one of the first power management chip and the second power management chip is a default power management chip, and the target programming signal comprises a common voltage, the common voltage being configured to be written into the default power management chip; and
the control circuit is further configured for keeping the programming signal input terminal being connected with the default power management chip when the target control signal input terminal is not detected at the control signal input terminal.

15. A printed circuit board comprising the power supply circuit according to claim 1.

16. A display module comprising a display panel and the power supply circuit according to claim 1, wherein the first power management chip and the second power management chip are connected with the display panel, respectively.

17. The display module according to claim 16, wherein the power supply circuit is located in a printed circuit board, and the display module further comprises:
a flexible circuit board connected the printed circuit board and the display panel; and a shielding tape being configured for fixing the printed circuit board and the display panel, the printed circuit board being located at a backlight side of the display panel.

18. A driving method of a power supply circuit applied to the power supply circuit according to claim 1, comprising:

provinding a target control signal to the control signal input terminal and providing a target programming signal to the programming signal input terminal, so that the control circuit causes the programming signal input terminal to be connected with a target power management chip and not to be connected with a non-target power management chip according to the target control signal to write the target programming signal into the target power management chip, wherein the target power management chip is any one of the first power management chip and the second power management chip, and the non-target power management chip is a power management chip, different from the target power management chip, among the first power management chip and the second power management chip.

19. The driving method according to claim 18, wherein the target control signal comprises a first control signal or a second control signal, and the target programming signal comprises a first programming signal or a second programming signal, the steps of providing the target control signal to the control signal input terminal and providing the target programming signal to the programming signal input terminal comprising:

providing the first control signal to the control signal input terminal and providing the first programming signal to the programming signal input terminal, so that the control circuit causes the programming signal input terminal to be connected with the first power management chip, and not to be connected with the second power management chip according to the first control signal to write the first programming signal into the first power management chip; or providing the second control signal to the control signal input terminal and providing the second programming signal to the programming signal input terminal, so that the control circuit causes the programming signal input terminal to be connected with the second power management chip, and not to be connected with the first power management chip according to the second control signal to write the second programming signal into the second power management chip.

* * * * *

UNITED STATES PATENT AND TRADEMARK OFFICE
CERTIFICATE OF CORRECTION

| | | |
|---|---|---|
| PATENT NO. | : 12,236,837 B2 | Page 1 of 1 |
| APPLICATION NO. | : 18/014440 | |
| DATED | : February 25, 2025 | |
| INVENTOR(S) | : Ying Zhang et al. | |

It is certified that error appears in the above-identified patent and that said Letters Patent is hereby corrected as shown below:

On the Title Page

Item (71) Applicant:
CHONGQING BOE OPTOELECTRONICS TECHNOLOGY CO., LTD., Chongqing (CN)

Should read as follows:
CHONGQING BOE OPTOELECTRONICS TECHNOLOGY CO., LTD., Chongqing (CN)
BOE Technology Group Co., Ltd., Beijing (CN)

Signed and Sealed this
Nineteenth Day of August, 2025

Coke Morgan Stewart
*Acting Director of the United States Patent and Trademark Office*